US009557556B2

(12) United States Patent
Sabry et al.

(10) Patent No.: US 9,557,556 B2
(45) Date of Patent: Jan. 31, 2017

(54) INTEGRATED APERTURED MICROMIRROR AND APPLICATIONS THEREOF

(71) Applicant: Si-Ware Systems, Cairo (EG)

(72) Inventors: Yasser M. Sabry, Cairo (EG); Diaa Abdel Maged Khalil, Cairo (EG); Mohamed Sadek, Cairo (EG)

(73) Assignee: SI-WARE SYSTEMS, Cairo (EG)

( * ) Notice: Subject to any disclaimer, the term of this patent is extended or adjusted under 35 U.S.C. 154(b) by 406 days.

(21) Appl. No.: 14/210,904

(22) Filed: Mar. 14, 2014

(65) Prior Publication Data

US 2014/0268174 A1    Sep. 18, 2014

Related U.S. Application Data

(60) Provisional application No. 61/803,035, filed on Mar. 18, 2013.

(51) Int. Cl.
| | | |
|---|---|---|
| *G02B 6/24* | (2006.01) | |
| *G02B 26/00* | (2006.01) | |
| *G01B 9/02* | (2006.01) | |
| *G01J 1/04* | (2006.01) | |
| *G02B 6/35* | (2006.01) | |
| *G02B 26/02* | (2006.01) | |

(Continued)

(52) U.S. Cl.
CPC ............ *G02B 26/001* (2013.01); *B81B 5/00* (2013.01); *G01B 9/02049* (2013.01); *G01J 1/0411* (2013.01); *G02B 6/24* (2013.01); *G02B 6/262* (2013.01); *G02B 6/29368* (2013.01); *G02B 6/29395* (2013.01); *G02B 6/353* (2013.01); *G02B 6/357* (2013.01); *G02B 6/3514* (2013.01); *G02B 6/3518* (2013.01); *G02B 6/3584* (2013.01); *G02B 6/3616* (2013.01); *G02B 26/02* (2013.01); *G02B 26/023* (2013.01); *G02B 1/005* (2013.01)

(58) Field of Classification Search
CPC .......... G02B 26/001; G02B 6/24; G02B 6/353
See application file for complete search history.

(56) References Cited

U.S. PATENT DOCUMENTS

| 5,056,098 A | 10/1991 | Anthony et al. |
|---|---|---|
| 5,132,836 A | 7/1992 | Fundingsland |

(Continued)

FOREIGN PATENT DOCUMENTS

| WO | 0159492 A2 | 8/2001 |
|---|---|---|
| WO | 2005028359 A1 | 3/2005 |

OTHER PUBLICATIONS

Toshiyoshi et al., Electrostatic Micro Torsion Mirrors for an Optical Switch Matrix; Journal of Microelectromechanical Systems; Dec. 1996; pp. 231-237; vol. 5, No. 4.

(Continued)

*Primary Examiner* — Hwa Lee
(74) *Attorney, Agent, or Firm* — Loza & Loza, LLP; Holly L. Rudnick

(57) ABSTRACT

An integrated apertured micromirror is provided in which the micromirror is monolithically integrated with a micro-optical bench fabricated on a substrate using a lithographic and deep etching technique. The micromirror has an aperture therein and is oriented such that the micromirror is optically coupled to receive an incident beam having an optical axis in a plane of the substrate and to at least partially transmit the incident beam therethrough via the aperture.

27 Claims, 17 Drawing Sheets

(51) Int. Cl.
  *G02B 6/36* (2006.01)
  *G02B 6/26* (2006.01)
  *G02B 6/293* (2006.01)
  *B81B 5/00* (2006.01)
  *G02B 1/00* (2006.01)

(56) References Cited

U.S. PATENT DOCUMENTS

| | | | |
|---|---|---|---|
| 7,796,267 | B2 | 9/2010 | Saadany et al. |
| 7,800,751 | B1 | 9/2010 | Silver et al. |
| 8,064,122 | B2 | 11/2011 | Hintersteiner |
| 2004/0027681 | A1* | 2/2004 | Sunagawa .......... G02B 26/0841 359/643 |
| 2004/0156580 | A1 | 8/2004 | Baumann |
| 2004/0228575 | A1 | 11/2004 | Kim |
| 2013/0100424 | A1 | 4/2013 | Sabry et al. |

OTHER PUBLICATIONS

Manzardo et al.; Miniaturized Time-Scanning Fourier Transform Spectrometer Based on Silicon Technology; Optics Letters; Dec. 1, 1999; pp. 1705-1707; vol. 24, No. 23.

Yu et al.; Micromachined Fourier Transform Spectrometer on Silicon Optical Bench Platform; Sensors and Actuators; 2006; pp. 523-530.

Sabry et al.; Optical Characterization Technique for MEMS Combo-Drive Resonators; IEEE; 2009; 2 pages.

Cai et al.; Linear MEMS Variable Optical Attenuator Using Reflective Elliptical Mirror; IEEE Photonics Technology Letters; Feb. 2005; pp. 402-404; vol. 17, No. 2.

Zhang et al.; Design and Experiment of 3-Dimensional Micro-Optical System for MEMS Tunable Lasers; MEMS 2006; 4 pages; Istanbul, Turkey.

Sabry et al.; In-plane diffraction loss free optical cavity using coated optical fiber and silicon micromachined spherical mirror; 7 pages.

Saadany et al.; Free-Space Tunable and Drop Optical Filters Using Vertical Bragg Mirrors on Silicon; IEEE Journal of Selected Topics in Quantum Electronics; Nov./Dec. 2006; pp. 1480-1488; vol. 12, No. 6.

Masson et al.; Tunable Fiber Laser using a MEMS-Based in Plane Fabry-Perot Filter; IEEE Journal of Quantum Electronics; Sep. 2010; pp. 1313-1319; vol. 46, No. 9.

Zhang et al.; Discrete wavelength tunable laser using microelectromechanical systems technology; Applied Physics Letters; Jun. 2004; pp. 329-331; vol. 84, No. 3.

Ait-Ameur et al.; High transverse mode discrimination in apertured resonators using diffractive binary optics; Optics Communications; Oct. 2000; pp. 73-78.

Stoltz et al.; High-quality factor optical microcavities using oxide apertured micropillars; Applied Physics Letters; Jul. 2005; 3 pages.

Yildiz; Infared Free Electron Laser, Resonator Parameters Optimization with Genesis, OPC and GLAD Codes; Mathematical and Computational Applications; 2011; pp. 659-668; vol. 16, No. 3.

International Searching Authority; International Search Report and Written Opinion; International Application No. PCT/US14/030268; Dec. 8, 2014; 14 pgs.

International Searching Authority; International Search Report and Written Opinion; International Application No. PCT/US14/030268; Sep. 9, 2014; 14 pgs.

\* cited by examiner

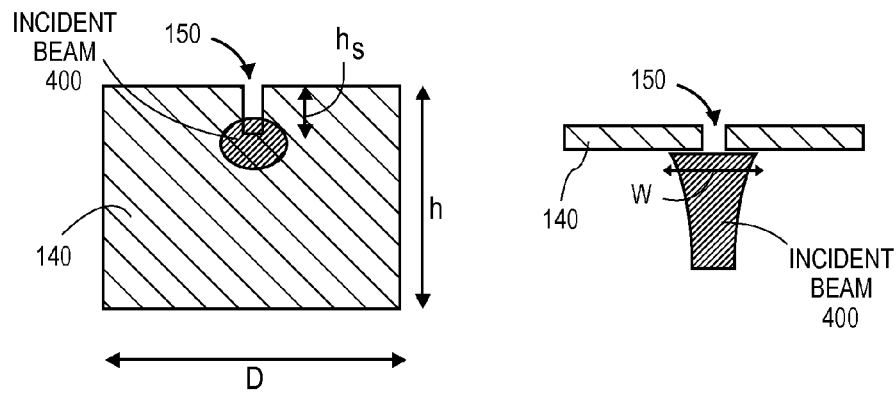
FIG. 6A
FIG. 6B
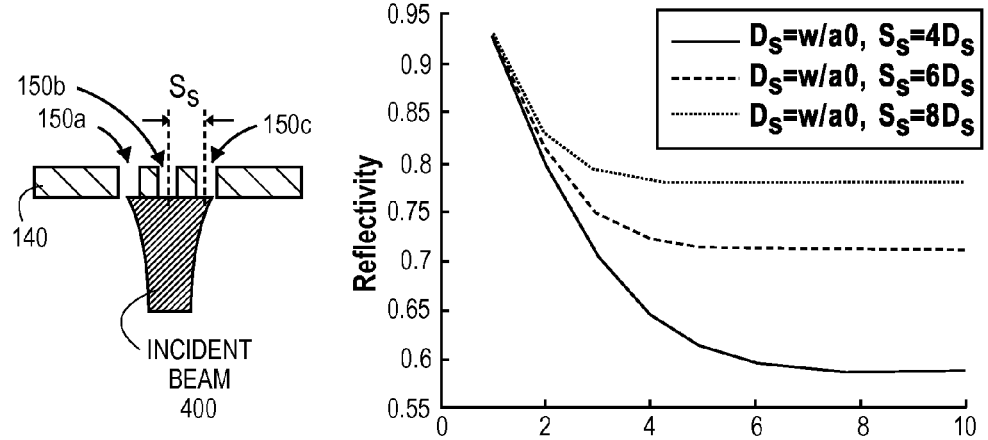
FIG. 7A
FIG. 7B

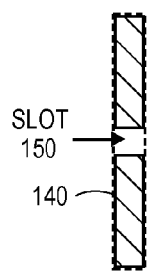
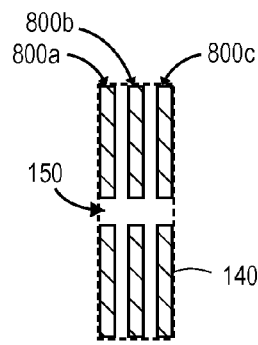
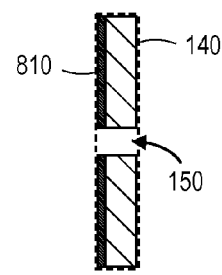
FIG. 8A    FIG. 8B    FIG. 8C
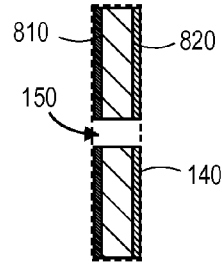
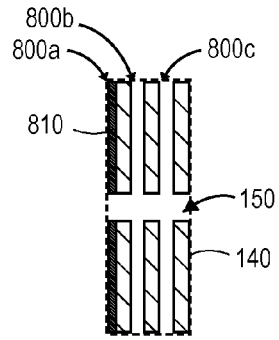
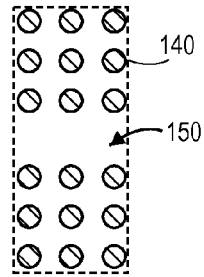
FIG. 8D    FIG. 8E    FIG. 8F
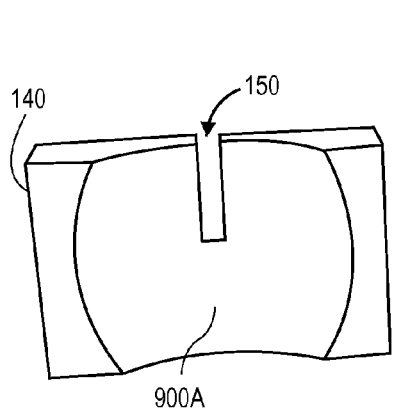
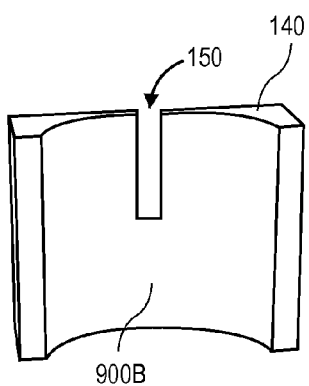
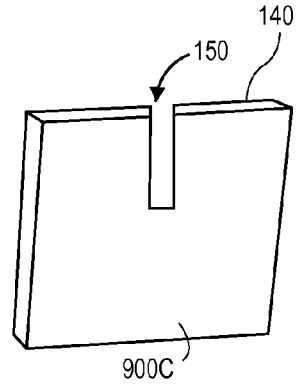
FIG. 9A    FIG. 9B    FIG. 9C

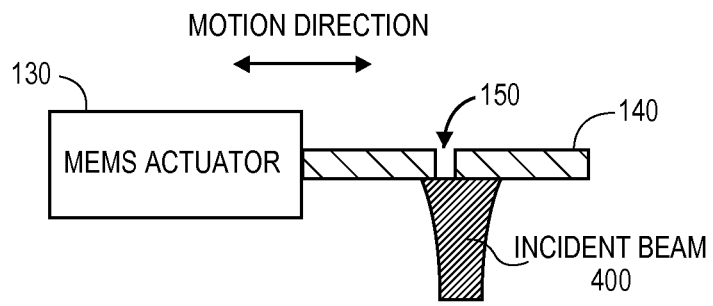
FIG. 10A
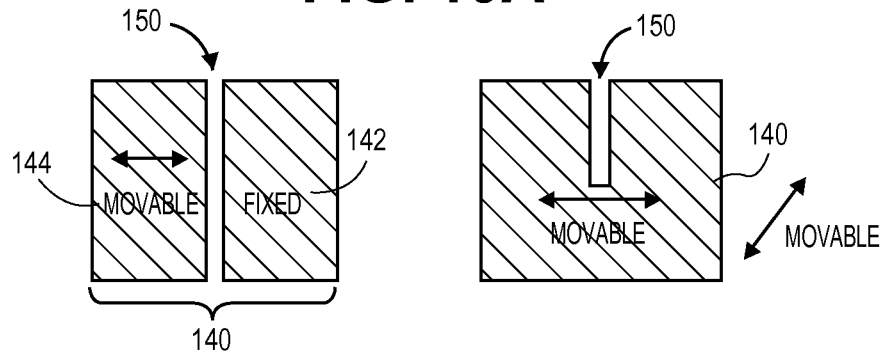
FIG. 10B   FIG. 10C
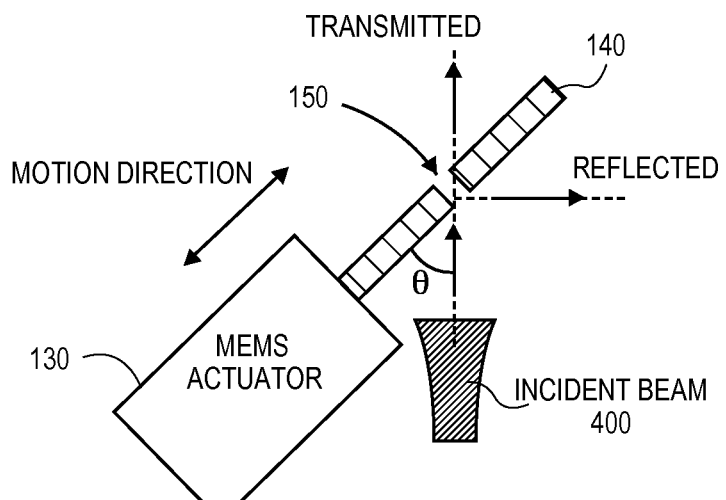
FIG. 11

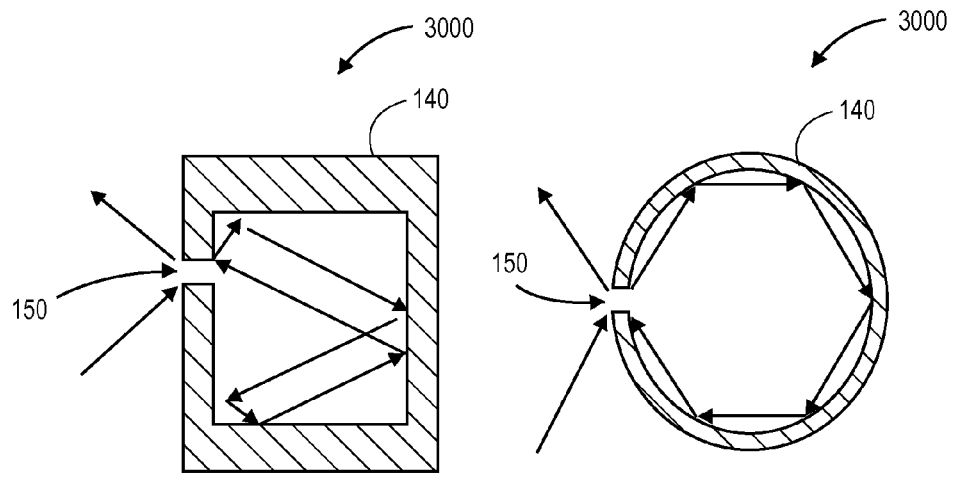
FIG. 30A  FIG. 30B
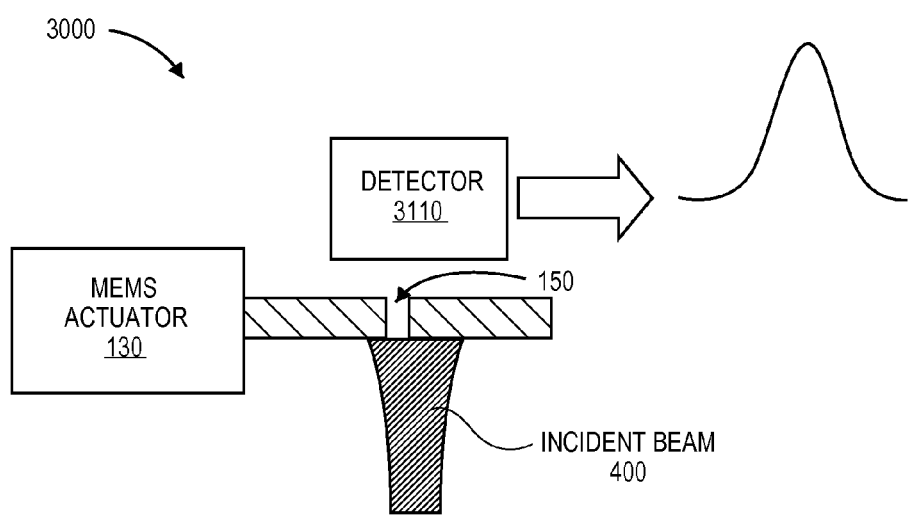
FIG. 31

INTEGRATED APERTURED MICROMIRROR AND APPLICATIONS THEREOF

CROSS REFERENCE TO RELATED PATENTS

The present U.S. Utility patent application claims priority pursuant to 35 U.S.C. §119(e) to the following U.S. Provisional patent application which is hereby incorporated herein by reference in its entirety and made part of the present U.S. Utility patent application for all purposes:

U.S. Provisional Application Ser. No. 61/803,035, entitled "Integrated Apertured Micromirror and Applications Thereof,", filed Mar. 18, 2013.

BACKGROUND OF THE INVENTION

Technical Field of the Invention

The present invention relates in general to optical systems, and in particular to optical systems including apertured micromirrors.

Description of Related Art

Conventional micromirrors can be found in the form of plain metallized mirrors, multi-layer dielectric mirrors or Photonic Crystal (PC) mirrors. For example, flat metallized micromirrors are typically used as wideband reflecting elements in micro-optical systems, such as an N×N optical MEMS switch, a Michelson interferometer, a monolithically integrated FTIR spectrometer or a Fabry-Perot interferometer. Cylindrical metallized micromirrors have also been introduced to form variable optical attenuators and to increase the coupling efficiency of MEMS tunable lasers. Recently, spherical metallized micromirrors have been utilized in micro-optical benches and optical cavities.

However, conventional metallized micromirrors are not capable of providing a transmission output from the mirror, and thus, cannot perform many desirable optical functions. Although thin metallized layers, on the order of a few nanometers, have been used to allow for transmission, controlling the thickness of the metal in a precise and repeatable way has proved difficult, thus rendering the process impractical, especially when the micromirror is integrated into an optical bench and the metal coating is applied on the vertical wall (sidewall) of the micromirror.

Dielectric and Photonic Crystal (PC) micromirrors, instead, can operate as partially reflecting/transmission elements in micro-optical systems, overcoming the limitations of the traditional metallized mirrors. For example, optical tunable filters have been developed from interleaved layers of silicon and air fabricated using deep etching technology on SOI wafers. However, the optical performance using such multi-layer mirrors is strongly dependent on the tolerance in the fabrication process due to the high sensitivity of the micromirror spectral characteristics to the layer thickness, verticality and smoothness. Therefore, the integration of such micromirrors with micro optical benches typically results in a reduced mirror reflectivity and limited bandwidth.

What is needed is a micromirror that can perform as a partially reflecting/transmitting optical element and that can be monolithically integrable into a micro-optical bench system.

SUMMARY OF THE INVENTION

Embodiments of the present invention provide an optical system including a substrate having a micro-optical bench etched therein using a lithographic and deep etching technique. The optical system further includes an apertured optical element that is monolithically integrated with the micro-optical bench and formed using the lithographic and deep etching technique. The optical element is optically coupled to receive an incident beam having an optical axis in a plane of the substrate and to at least partially transmit the incident beam therethrough via the aperture.

In one embodiment, the aperture has a rectangular shape, a trapezoidal shape, a triangular shape, a rounded shape or an arbitrary shape determined by the lithographic and deep etching technique. In a further embodiment, the optical element includes at least two apertures that are homogenous with respect to at least one of a height of each of the at least two apertures, width of each of the at least two apertures and separation between the at least two apertures. In various embodiments, at least one side of the optical element may be metallized, the optical element may include at least two layers of dielectric material such that the aperture passes through each of the layers, the optical element may include a photonic crystal mirror and/or the optical element may be curved in two dimensions or three dimensions.

In another embodiment, the optical element has a reflectivity. The reflectivity may be determined at least in part by one or more of a width of the aperture, an amount of offset between a center of the aperture and the optical axis of the incident beam and a number of apertures within the optical element.

In a further embodiment, the optical system further includes a translation device coupled to the optical element to cause a displacement thereof, and the reflectivity of the optical element is determined at least in part by the displacement of the optical element with respect to the incident beam. In an exemplary embodiment, the optical element includes a first part and a second part, the aperture is formed between the first part and the second part and the first part is coupled to the translation device such that a width of the aperture is varied by the displacement of the first part. In another exemplary embodiment, the translation device is coupled to the optical element to cause motion of the optical element at a tilted angle with respect to the optical axis of the incident beam.

In a further exemplary embodiment, the micro-optical bench includes a Fabry-Perot interferometer within an inertial sensor, the inertial sensor includes an optical fiber and the optical element and optical fiber collectively form a low-finesse Fabry Perot cavity within the Fabry-Perot interferometer. In still a further exemplary embodiment, the micro-optical bench includes an optical filter formed using the optical element, and the optical filter has a filter response tunable by the translation device causing motion of the optical element in a same direction as the optical axis of the incident beam. The optical filter may be formed between a multi-layer coated optical fiber and the optical element or between the optical element and an additional apertured optical element.

In embodiments in which the optical filter is formed between two apertured optical elements, the optical filter may operate as a two-beam interferometer to produce a two-beam interference response with sinusoidal fringes. In addition, at least one of the apertured optical elements may have a curved surface profile. In another embodiment in which the incident beam is a collimated beam incident on one of the apertured optical elements that includes at least two apertures therein, an in-plane Bessel beam may be produced within the optical filter.

In another exemplary embodiment in which the apertured optical element is coupled to the translation device, the micro-optical bench further includes a coupled cavity filter formed by the optical element, and the coupled cavity filter has a filter response tunable by the translation device. In still another exemplary embodiment, the optical system further includes a detector optically coupled to receive an output of the optical element through the aperture, and the output corresponds to an optical intensity of the incident beam at discrete spatial positions determined by the translation device.

BRIEF DESCRIPTION OF THE DRAWINGS

A more complete understanding of the present invention may be obtained by reference to the following detailed description when taken in conjunction with the accompanying drawings wherein:

FIGS. 6A and 6B illustrate front and top views of an exemplary apertured optical element having a shortened aperture, in accordance with embodiments of the present invention;

FIG. 7A illustrates a front view of an exemplary apertured optical element having multiple apertures, in accordance with embodiments of the present invention;

FIG. 7B is a graph illustrating the variation of the reflectivity of the apertured optical element with the number of apertures, in accordance with embodiments of the present invention;

FIGS. 8A-8F illustrate exemplary types of apertured optical elements, in accordance with embodiments of the present invention;

FIGS. 9A-9C illustrate exemplary surface profiles of the apertured optical element, in accordance with embodiments of the present invention;

FIGS. 10A-10C illustrate exemplary configurations of a moveable apertured optical element, in accordance with embodiments of the present invention;

FIG. 11 illustrates an exemplary controllable power divider including the apertured optical element, in accordance with embodiments of the present invention;

FIGS. 30A and 30B illustrate exemplary optical micro resonators, in accordance with embodiments of the present invention;

FIG. 31 illustrates an exemplary beam profiling instrument including an apertured optical element, in accordance with embodiments of the present invention;

DETAILED DESCRIPTION OF THE DRAWINGS

In accordance with embodiments of the present invention, an integrated apertured micromirror is provided that is capable of performing as partially reflecting/transmitting optical element. The apertured micromirror is monolithically integrable in micro-optical bench systems on a substrate. In one embodiment, the apertured micromirror is free-standing and attached to a translation device, such as a Micro Electro-Mechanical Systems (MEMS) actuator, for motion induction. The overall micro-optical bench, containing optical as well as MEMS components, can be fabricated using deep etching technology, in a monolithically integrated and self-aligned manner. Thus, the reflection and transmission coefficient of the micromirror can be precisely controlled during the fabrication process. As such, the integrated apertured micromirror offers controllable and fabrication-tolerant reflectivity and transmission over a wide band.

Such apertured micromirrors may be used, for example, in the production of wideband integrated tunable filters. In other embodiments, an integrated micro-optical bench with apertured micromirrors and micro actuators may have direct applications in beam splitting, optical cavities, micro resonators, tunable lasers, beam profiling and Bessel beam generation.

Figure 1:
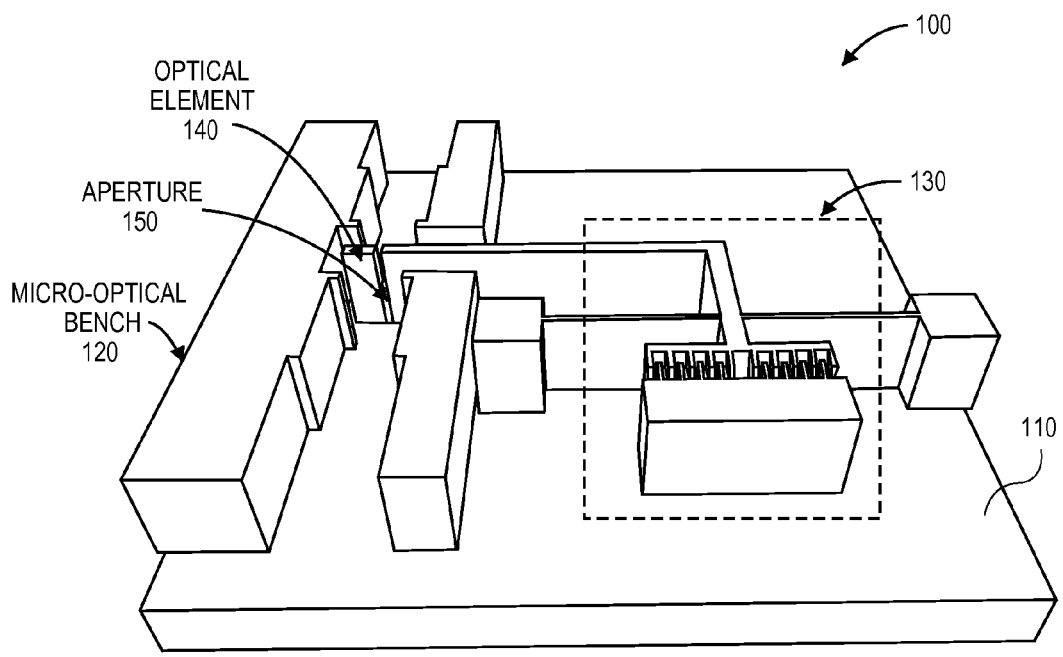
FIG. 1 illustrates an exemplary optical system including an apertured optical element, in accordance with embodiments of the present invention.

Referring now to FIG. 1, there is illustrated an exemplary optical system 100, in accordance with embodiments of the present invention. As shown in FIG. 1, the optical system 100 includes a micro-optical bench 120 having an optical element 140 integrated therewith. The optical element 140 is a micromirror having an aperture 150 therein to provide not only a wideband reflection response, but also a wideband transmission response. Monolithic integration of the micromirror 140 in a self-aligned manner with the micro-optical bench 120 is achieved by fabricating the micro-optical bench 120 on a substrate 110. In addition, other features, such as micromachined grooves, can be fabricated in the micro-optical bench 120 for integration of detectors and optical sources, including but not limited to, optical fibers. The apertured micromirror 140 is further shown attached to a translation device 130. In an exemplary embodiment, the translation device 130 is a MEMS actuator. Integration of the micromirror 140 with one or more micromirrors of the same or different type enables a tremendous number of applications; some of which will be described hereafter.

The micromirror 140 is apertured in the sense that it allows for the incident optical power to reflect from and to transmit through the micromirror regardless of the surface coating on the mirror. For example, an apertured micromirror having a metallized surface offers both reflection and transmission responses. The aperture 150 shape and physical dimensions are a matter of design.

Figures 2A, 2B, 2C, 2D:
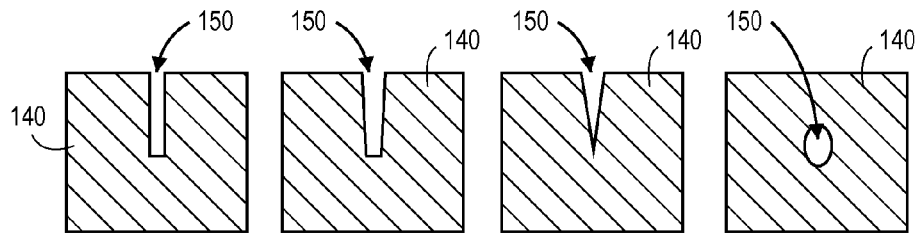
FIGS. 2A-2D illustrate exemplary aperture shapes, in accordance with embodiments of the present invention.

Referring now to FIGS. 2A-2D, different shapes of the aperture 150 are illustrated. FIGS. 2A-2D are side views when the micromirror 140 is normal to the micro-optical bench substrate or top views when the micromirror 140 is parallel to the micro-optical bench substrate. In an exemplary embodiment, as shown in FIG. 2A (and also shown in FIG. 1), the aperture 150 has a rectangular shape, forming a slot in the micromirror 140. However, in other embodiments, the aperture 150 may have a trapezoidal shape, as shown in FIG. 2B, or a re-entrant (triangular) shape, as shown in FIG. 2C. A rectangular-shaped aperture 150 offers uniform reflection and transmission along the aperture height, while a trapezoidal or any reentrant-shaped aperture 150 provides a variable optical response along its height. The rectangular aperture 150 can be opened along all the height of the micromirror or partially opened, the latter being illustrated in FIG. 2A.

Any of the aperture shapes shown in FIGS. 2A-2C are compatible with micromachining technologies widely used in micro-optical benches, where the optical axis of the incident beam is parallel to the substrate. In addition, more complex shapes can be implemented. For instance, different etching techniques can be combined to achieve a rounded aperture shape, as shown in FIG. 2D. Arbitrary shapes can be also generated when the micromirror is fabricated on the substrate top surface, when the optical axis of the incident beam is normal to the substrate. In this case, the aperture cross section can be fully controlled by lithographic techniques.

Figures 3A, 3B, 3C:
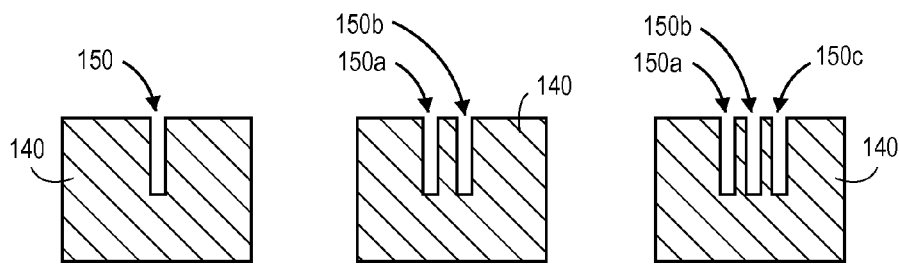
FIGS. 3A-3C illustrate exemplary optical elements with different numbers of apertures, in accordance with embodiments of the present invention.

The response of the apertured micromirror 140 to different incident optical beams can be optimized in many ways. Besides controlling the aperture shape, the number of apertures/slots 150 in the micromirror 140 can range from one to many, as shown in FIGS. 3A-3C. In embodiments in which the micromirror 140 includes multiple apertures/slots 150a-150c, as shown in FIGS. 3B and 3C, the apertures/slots 150a-150c can be homogenous or not in terms of their heights, widths and the separation between them.

Figure 4A:
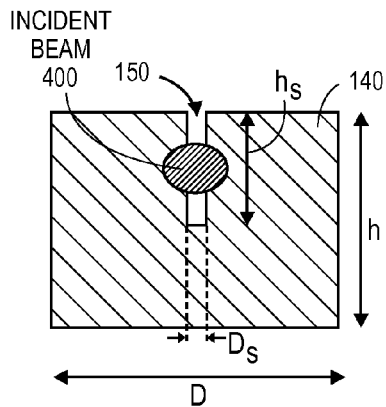
FIGS. 4A and 4B illustrate front and top views of an exemplary apertured optical element having a Gaussian beam incident thereon, in accordance with embodiments of the present invention.
Figure 4B:
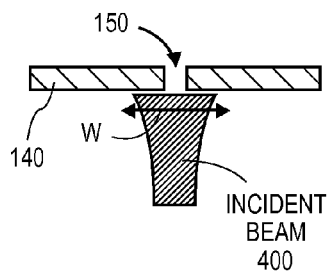
Figure 4C:
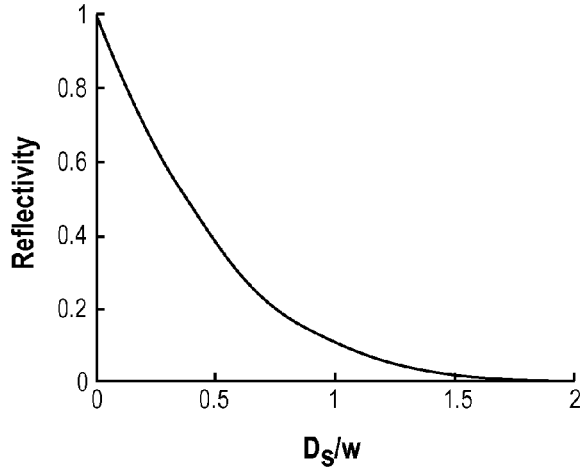
FIG. 4C is a graph illustrating the exemplary reflectivity of the apertured optical element of FIGS. 4A and 4B verses the normalized aperture width, in accordance with embodiments of the present invention.

Referring now to FIGS. 4A-4C, an optical field in the form of a Gaussian beam 400 is shown incident across the aperture 150 on the front side of the micromirror 140. The micromirror 140 has a height h and a width D, while the incident beam 400 has a spot diameter w. The distance from the top of the micromirror 140 to the bottom of the aperture 150 (slot height) is denoted $h_s$, while the width of the aperture/slot (slot width) is denoted $D_s$.

The effect of changing the slot width $D_s$ is shown in FIG. 4C. In FIG. 4C, the slot width $D_s$ is normalized with respect to the incident beam spot diameter w. In addition, the reflectivity and transmission of the micromirror 140 are complementary. As can be seen in FIG. 4C, increasing the slot width $D_s$ leads to an increase in the transmitted power and a decrease in the reflected power.

Figure 5A:
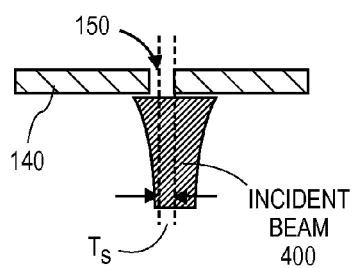
FIG. 5A illustrates a front view of an exemplary apertured optical element having a shifted position with respect to the incident beam axis, in accordance with embodiments of the present invention.
Figure 5B:
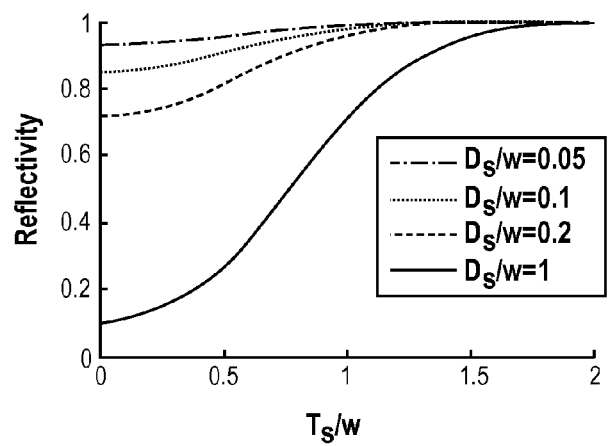
FIG. 5B is a graph illustrating the exemplary reflectivity of the apertured optical element of FIG. 5A verses the normalized shift between the incident beam axis and the aperture central line, in accordance with embodiments of the present invention.

Referring now to FIGS. 5A and 5B, the reflectivity of the apertured micromirror 140 can be also engineered by shifting the position of the mirror with respect to the optical axis of the incident beam 400, such that the incident beam optical axis is shifted an amount Ts with respect to the central line of the aperture/slot 150. FIG. 5B illustrates a family of curves produced by combining variations of the slot width $D_s$ and its associated shift $T_s$. It should be noted that in FIG. 5B, the transmission response is the complimentary of the reflection response. As can be seen in FIG. 5B, by shifting the aperture/slot 150 away from the beam axis, the reflectivity tends to unity and the transmission drops to zero.

Referring now to FIGS. 6A and 6B, a similar response to that shown in FIG. 5B can be obtained when the beam 400 only partially overlaps the slot 150 along the slot height $h_s$. In this embodiment, the micromirror 140 fully reflects the incident beam 400 below the slot 150.

Turning now to FIGS. 7A and 7B, the reflectivity of the micromirror 140 can be also controlled by increasing the number of slots 150a-150c. As can be seen in FIG. 7B, there is an effective decrease in the reflectivity with increasing numbers of slots down to a certain limit beyond which the added slots are out of the physical dimension of the incident beam. Multiple curves are drawn in FIG. 7B for different separations between the slots $S_s$.

In principle, the apertured (or slotted) micromirror 140 can be of any type, as shown in the top views of the micromirror 140 provided in FIGS. 8A-8E. It should be noted that the micromirror 140 as a whole is shown enclosed inside the dashed-line box in FIGS. 8A-8E. The aperture/slot 150 is also shown passing through the entire micromirror 140 in each of FIGS. 8A-8E.

The aperture/slot 150 can be made in a single-layer dielectric micromirror 140, as shown in FIG. 8A, or in a multi-layer dielectric micromirror (formed of multiple layers 800a-800c of dielectric material separated by air), as shown in FIG. 8B. The combined effect of the Bragg reflection of the multi-layer micromirror 140 of FIG. 8B, together with the aperture 150, can produce a desired optical performance in terms of the overall micromirror reflectivity response.

As shown in FIG. 8C, the micromirror 140 can include a metal layer 810 on one side while the other side is left uncoated. In this embodiment, the micromirror 140 may be configured within the micro-optical bench, for example, to behave as a mirror on the metallized side 810 and as part of a Fabry-Perot cavity on the other side. The micromirror 140 can also be double-sided metallized (i.e., metal layers 810 and 820 can be formed on both sides of the micromirror 140). The metallization material and/or thickness can be the same or different on each side. In embodiments in which the material and/or thickness of the metal layers 810 and 820 are different, the micromirror 140 will have asymmetric reflection responses from each side.

As shown in FIG. 8E, a metal layer 810 can be formed on one side of a slotted multi-layer micromirror 140 (i.e., having interleaved layers of silicon 800a-800c and air), thus producing a "slotted super mirror." As shown in FIG. 8F, the slotted micromirror 140 may also be a slotted photonic crystal micromirror, which may provide a wideband high reflectivity response. In other embodiments, other types of slotted micromirrors may be used, such as slotted plasmonic or metamaterial micromirrors.

Referring now to FIGS. 9A-9C, the surface profile of the slotted micromirror 140 can be flat or curved either in two-dimensions or three-dimensions. For example, the surface profile of the slotted micromirror 140 can be spherical, as shown in FIG. 9A, cylindrical, as shown in FIG. 9B, or flat, as shown in FIG. 9C. In addition to the partial reflection/transmission of the micromirror 140, a curved mirror, such as that shown in FIG. 9A or 9B, can transform the incident beam in terms of focusing and collimation.

FIGS. 10A-10C illustrate exemplary configurations of a moveable apertured micromirror 140, in accordance with embodiments of the present invention. As shown in FIG. 10A, the apertured micromirror 140 can be attached to a translation device 130, such as a MEMS actuator, to cause a displacement of the micromirror 140 with respect to the incident optical beam and to control the reflectivity of the micromirror 140. In one embodiment, as shown in FIG. 10C, the aperture/slot 150 may extend through only a portion of the height of the micromirror 140, such that the MEMS actuator 130 is coupled to move the entire micromirror 140, including the slot 150, with respect to the incident beam 400. In another embodiment, as shown in FIG. 10B, the aperture/slot 150 can extend through the entire height of the micromirror 140, thus providing a configuration in which the micromirror includes two parts 142 and 144 separated by the slot 150. In this embodiment, one part 144 can be coupled to the MEMS actuator 130 to effectively vary the width of the slot 150.

In an exemplary embodiment in which the micromirror 140 forms an external cavity with a semiconductor laser, the tuning range of the tunable laser can be controlled via the MEMS actuator 130. For example, with two-dimensional motion of the micromirror 140 along the optical axis of the incident beam 400 (i.e., in the same direction as the optical axis of the incident beam 400), the cavity length can be controlled, thereby tuning the lasing wavelength. Moreover, the stability of the laser can be improved by varying the cavity length and/or slot width.

In another embodiment, as shown in FIG. 11, a controllable power divider can be achieved by orienting the micromirror 140 attached to the MEMS actuator 130 at an angle θ with respect to the optical axis of the incident beam 400. In such a configuration, the micromirror 140 is moveable in a tilted motion with respect to the incident beam optical axis. In this embodiment, the reflected beam is not folded back on the incident beam 400 and can be detected. Having the slot 150 in the micromirror 140 enables transmission of the incident beam through the micromirror 140, so that the transmitted beam can also be detected. The incident, reflected and transmitted beams can be generated and collected, for example, by optical fibers.

Figure 12:
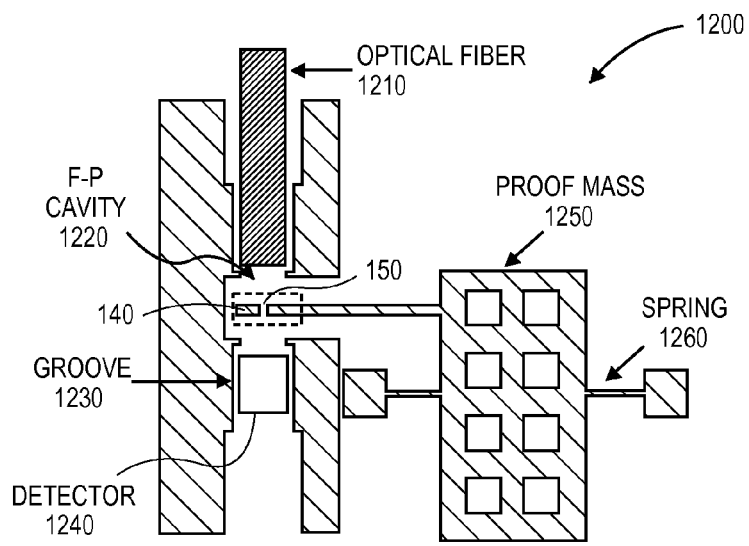
FIG. 12 illustrates an exemplary inertial sensor including the apertured optical element, in accordance with embodiments of the present invention.

In still another embodiment, as shown in FIG. 12, the apertured micromirror 140 can be utilized in a micro-optical bench forming an inertial sensor 1200 by integrating the apertured micromirror 140 within an interferometer, such as a Fabry-Perot interferometer. The Fabry-Perot interferometer includes an optical fiber 1210 that operates with the apertured micromirror 140 to form a low-finesse Fabry-Perot cavity therebetween. The inertial sensor 1200 further includes a translation device, such as a proof mass 1250 and mechanical spring 1260, coupled to the apertured micromirror 140. An optical detector 1240 can be also integrated into a micromachined groove 1230 facing the micromirror 140. Since the apertured micromirror 140 allows for a transmission output, there is no need for reflection-type measurements based on an optical directional coupler. In an exemplary operation, when the proof mass 1250 is deflected, the cavity length is changed and the transmitted power through the micromirror 140 and detected by the detector 1240 is varied.

Figure 13:
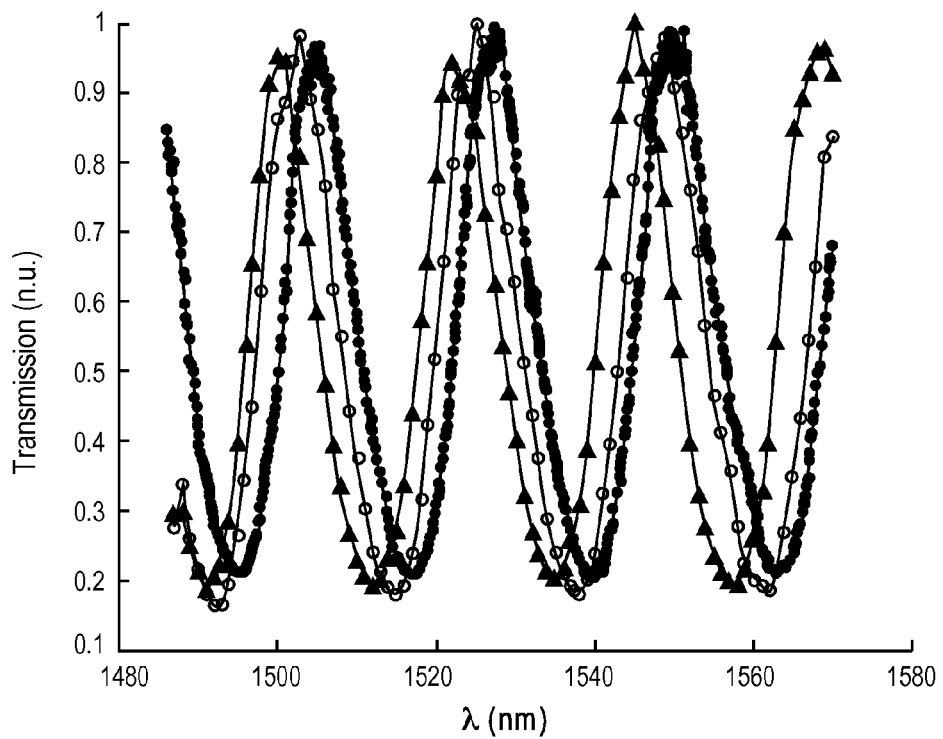
FIG. 13 is a graph illustrating exemplary data for the inertial sensor of FIG. 12, in accordance with embodiments of the present invention.

The transmitted output of such a low-finesse Fabry-Perot interferometer including a metallized slotted micromirror 140 and an optical fiber 1210 has a high visibility, which may be an important performance parameter in some optical designs. Experimental data for the inertial sensor shown in FIG. 12 based on a cleaved single-mode optical fiber and metallized slotted micromirror is given in FIG. 13. The high visibility of the transmitted output is clearly seen in FIG. 13.

Figure 14:
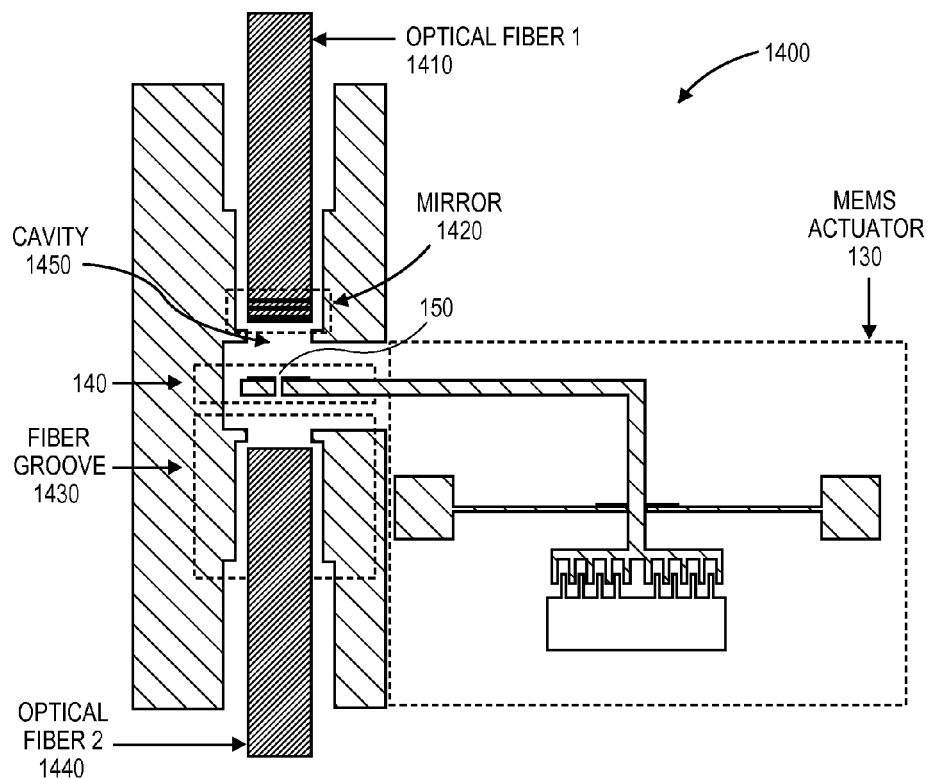
FIG. 14 illustrates an exemplary optical tunable filter including the apertured optical element, in accordance with embodiments of the present invention.

In another embodiment, as shown in FIG. 14, the apertured micromirror 140 can be utilized in a micro-optical bench forming an integrated tunable optical filter 1400. In one embodiment, the apertured (or slotted) micromirror 140 is monolithically integrated into an SOI micro-optical bench and fabricated using deep etching technology, as can be seen in the top view of FIG. 14. An optical filter cavity 1450 is formed between a multi-layer dielectric-coated micromirror 1420 formed on a surface of an input optical fiber 1410 and the metallized apertured/slotted micromirror 140. The slotted micromirror 140 is coupled to a MEMS actuator 130 for tuning the filter response. The MEMS actuator 130 can be optimized, for example, for quasi-static or high speed operation. The transmitted output of the filter 1450 via the aperture/slot 150 is collected by another optical fiber 1440 inserted into a micromachined fiber groove 1430 self-aligned with the apertured micromirror 140. In other embodiments, an optical detector can be used to collect the transmitted output.

Figure 15:
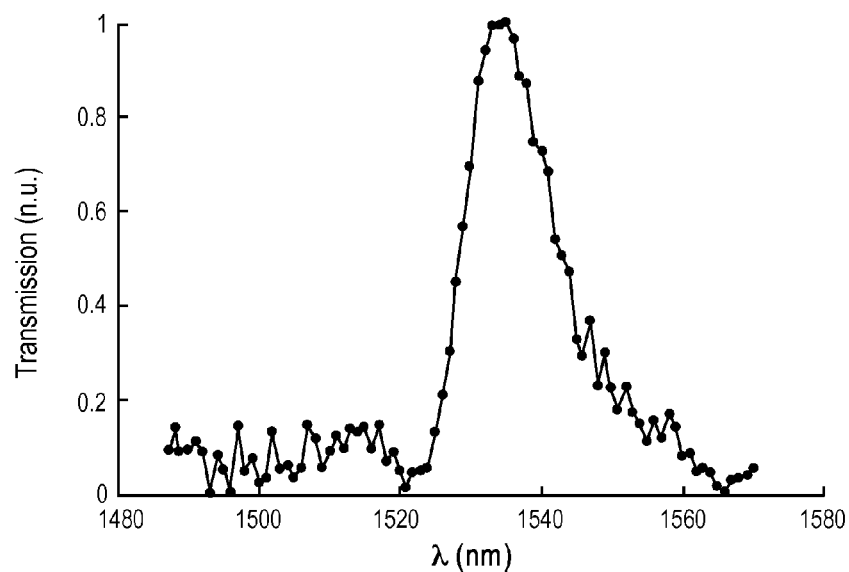
FIG. 15 is a graph illustrating exemplary data for the optical filter of FIG. 14, in accordance with embodiments of the present invention.
Figure 16:
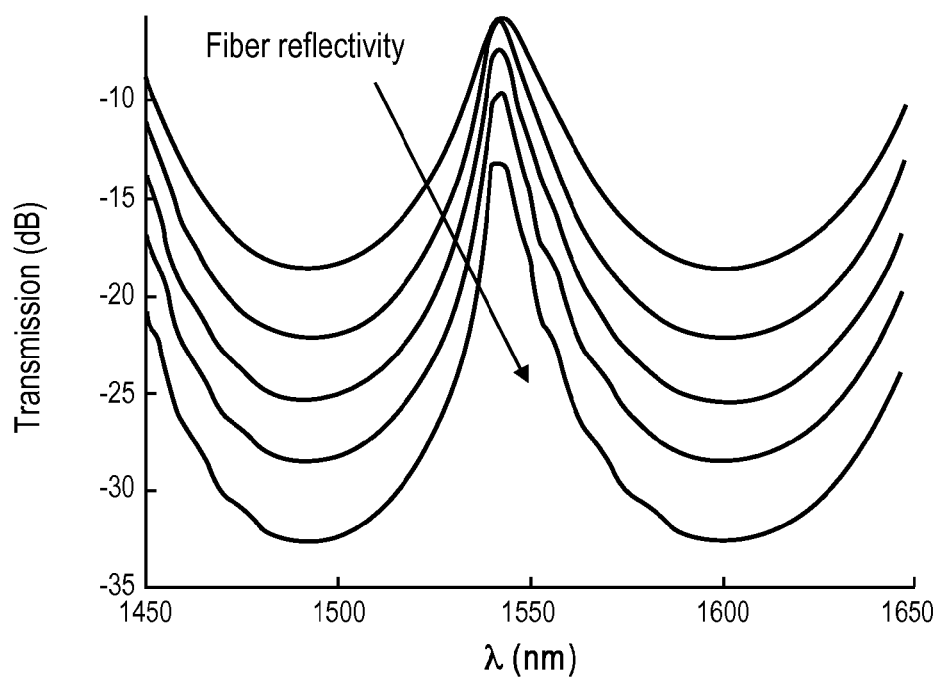
FIG. 16 is a graph illustrating exemplary transmission responses of the optical filter of FIG. 14, in accordance with embodiments of the present invention.
Figure 17:
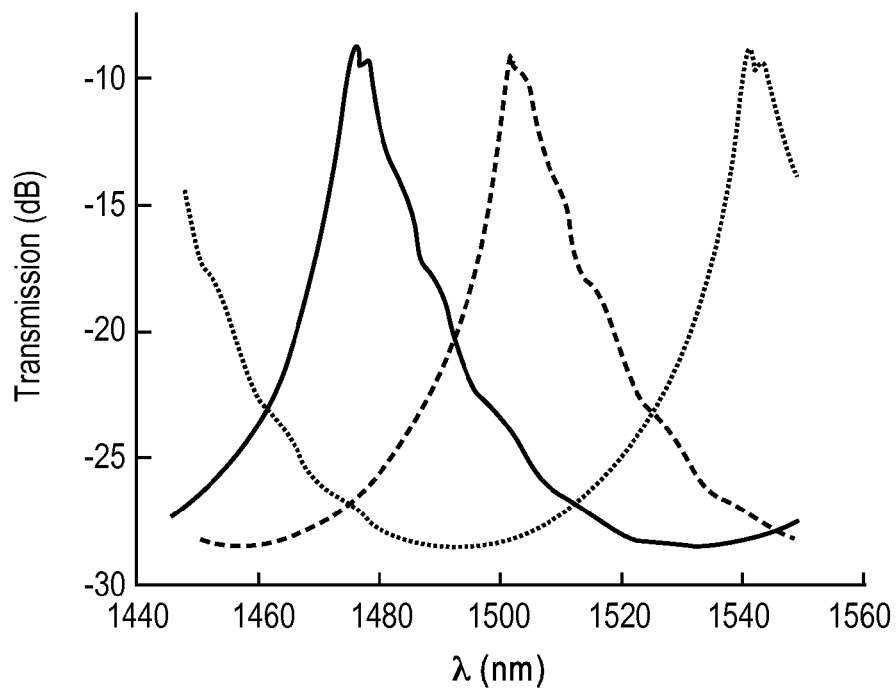
FIG. 17 is a graph illustrating exemplary transmission responses of the optical filter of FIG. 14 with displacement of the apertured optical element, in accordance with embodiments of the present invention.

Experimental data for the optical filter 1400 shown in FIG. 14 based on a multi-layer coated single-mode optical fiber and metallized slotted micromirror is given in FIG. 15. The effect of the reflectivity of the optical fiber 1410 on the filter transmission response is shown in FIG. 16. In FIG. 16, the input beam spot radius was 5 μm, the power reflectivity of the metallized slotted micromirror was 0.95, the cavity length was 11 μm and the slot width was 0.5 μm. The response is given for different coated fiber power reflectivities of 0.99, 0.95, 0.9, 0.8 and 0.6. Using the MEMS actuator, the filter response can be tuned, as shown in FIG. 17. In FIG. 17, the same parameters as that of FIG. 16 were used with a ±0.3 μm displacement of the slotted micromirror and a fiber reflectivity of 0.95.

Figure 18:
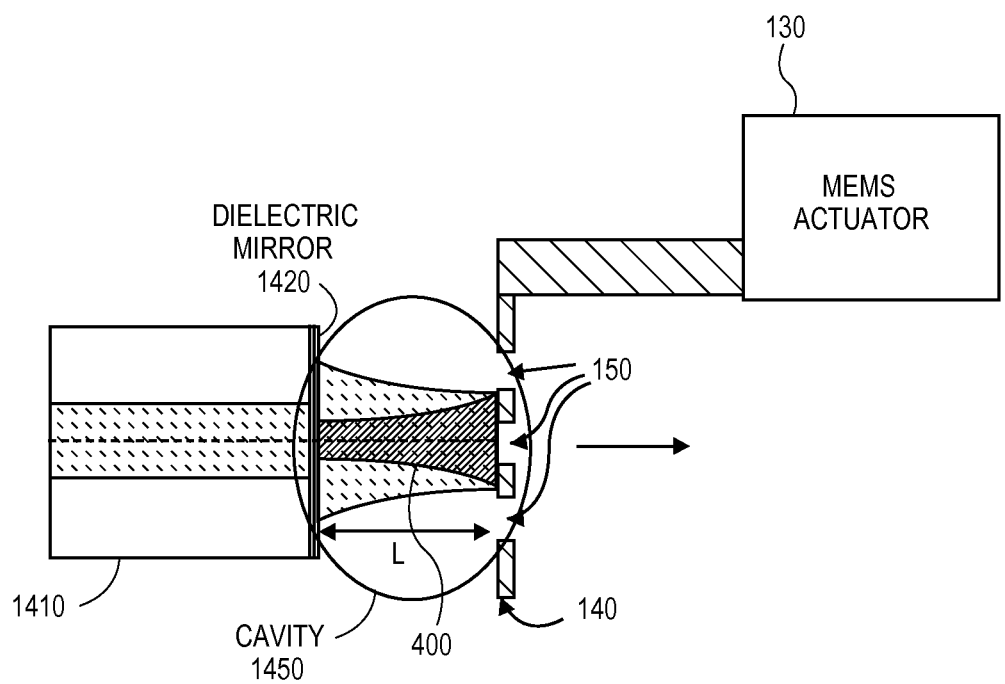
FIG. 18 illustrates an exemplary optical tunable filter including a multi-apertured optical element, in accordance with embodiments of the present invention.
Figure 19:
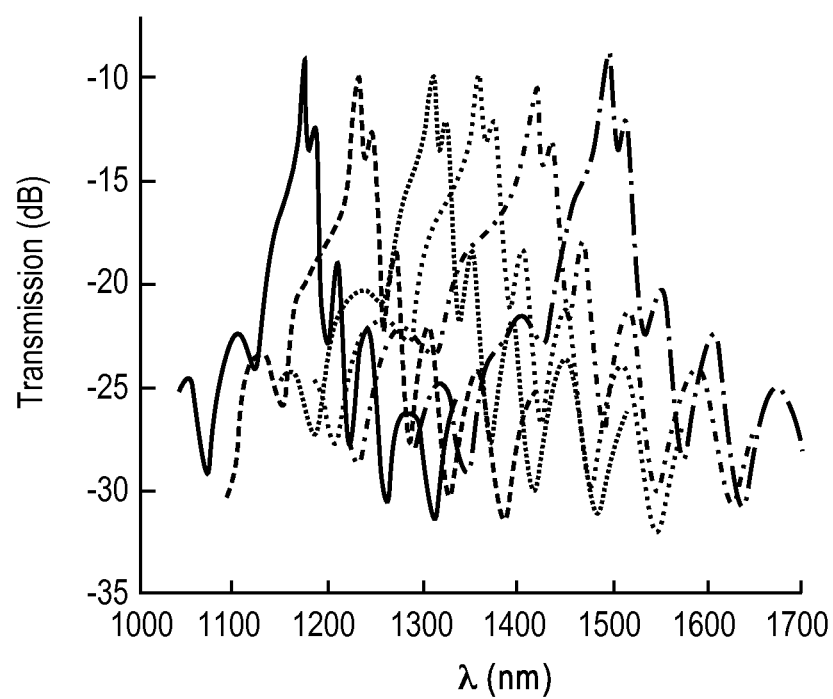
FIG. 19 is a graph illustrating exemplary transmission responses of the optical filter of FIG. 18, in accordance with embodiments of the present invention.

In a further embodiment, as shown in FIG. 18, the slotted micromirror 140 can have more than one aperture/slot 150 to optimize the filter response depending on the type of the optical fiber 1410 used (i.e. single-mode or multi-mode optical fiber, small or large fiber core size and/or cleaved or lensed fiber surface). This optimization, when combined with a short cavity length L leads to a tunable filter with very wide free-spectral range, as shown in FIG. 19. In FIG. 19, the input beam spot radius was 25 μm and the power reflectivity of the slotted metallized mirror and fiber coated mirror was 0.95. In addition, the cavity length was varied between 1.8 and 2.5 μm, the slot width was 1 μm, and the number of slots was 5, each separated from one another by 15 μm.

Figure 20:
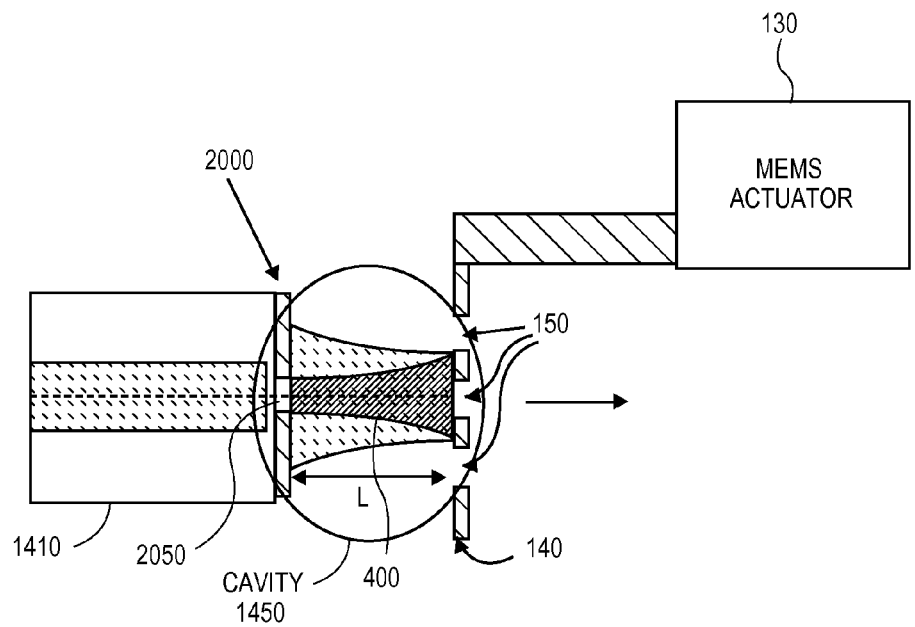
FIG. 20 illustrates an exemplary optical tunable filter including two apertured optical elements, in accordance with embodiments of the present invention.

In another embodiment, as shown in FIG. 20, the filter cavity 1450 can be formed between two apertured (slotted) micromirrors 140 and 2000, one of which is formed on the surface of the optical fiber 1410. One or both of the micromirrors 140 and 2000 can be of the single or multi-slot types. For example, as shown in FIG. 20, micromirror 140 includes multiple slots 150, while micromirror 2000 includes only a single slot 2050. The slots 150 and 2050 can be aligned or shifted with respect to each other. In addition, one or both of the micromirrors 140 and 2000 can be attached to the MEMS actuator 130.

Figure 21:
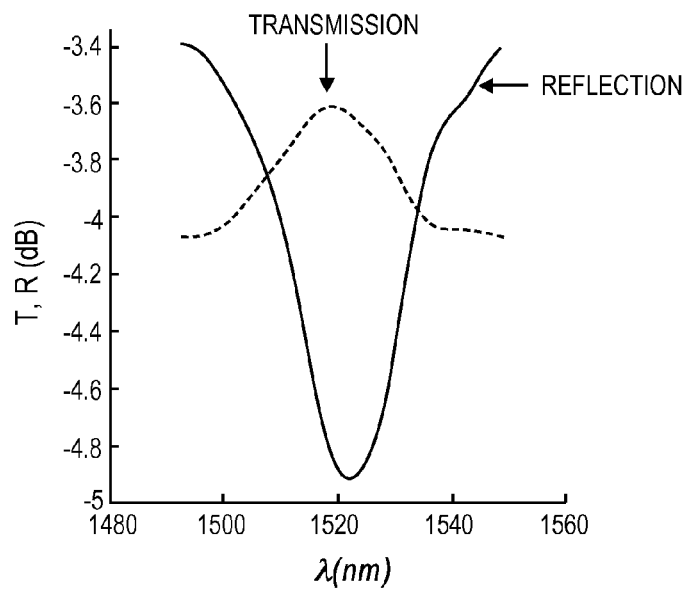
FIG. 21 is a graph illustrating an exemplary two-beam interference response produced by the optical filter of FIG. 20, in accordance with embodiments of the present invention.

One feature of having two slotted micromirrors is the ability to design the cavity 1450 such that the bouncing beam 400 escapes after two round trips. In this manner, the cavity 1450 behaves as a two-beam interferometer with sinusoidal fringes, as shown in FIG. 21. In FIG. 21, the input beam spot radius was 5 μm, the power reflectivity of the two slotted metalized flat mirrors was 0.95, the cavity length was 20 μm and there was one slot per micromirror, each having a slot width of 5 μm.

Figure 22:
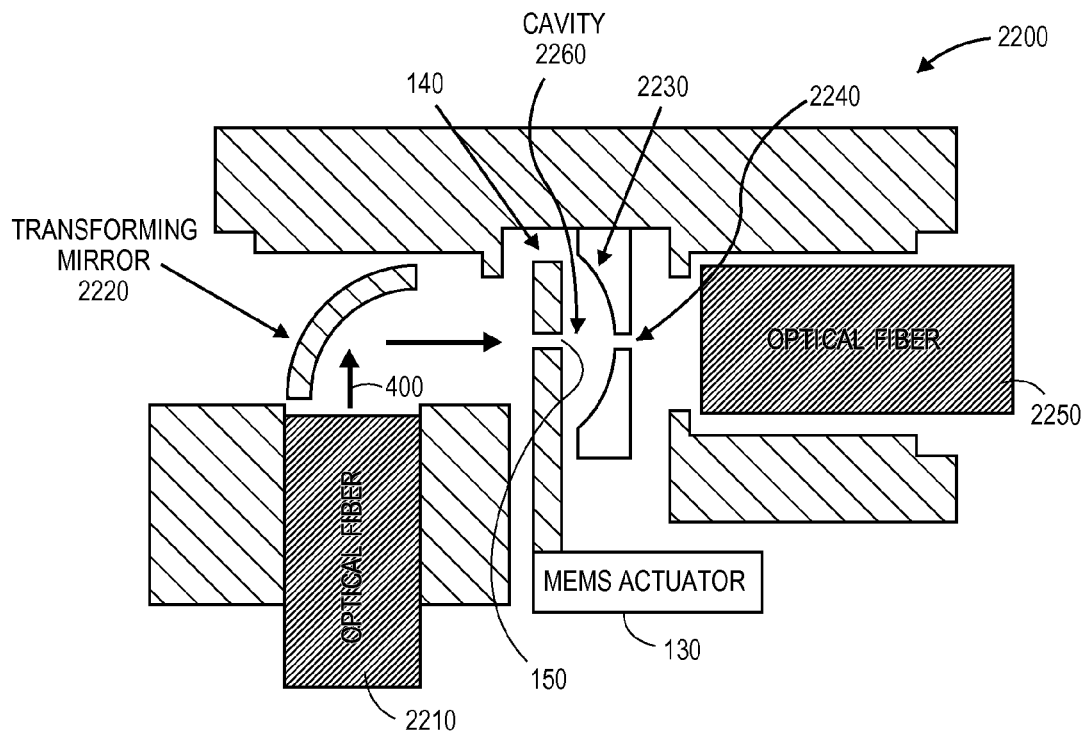
FIG. 22 illustrates an exemplary optical tunable filter including two metallized apertured optical elements, in which at least one of the apertured optical elements has a curved surface, in accordance with embodiments of the present invention.

The input beam 400 to the cavity be provided directly from a laser or optical fiber, as shown in FIG. 20, or in another embodiment, the input beam 400 from the optical fiber 2210 can first be transformed using a curved mirror 2220, as shown in FIG. 22. This transformation provides independent control on the input beam properties in the in-plane and out-planes directions with respect to the micro-optical bench substrate.

In addition, one or both of the micromirrors 140 and 2230 forming the filter cavity 2260 can have a curved surface profile to produce an optical filter 2200 with an inverted filter response. As in FIG. 20, each of the micromirrors 140 and 2230 of FIG. 22 includes one or more apertures/slots 150 and 2240. The transmission output is collected by an optical fiber 2250.

Figure 23:
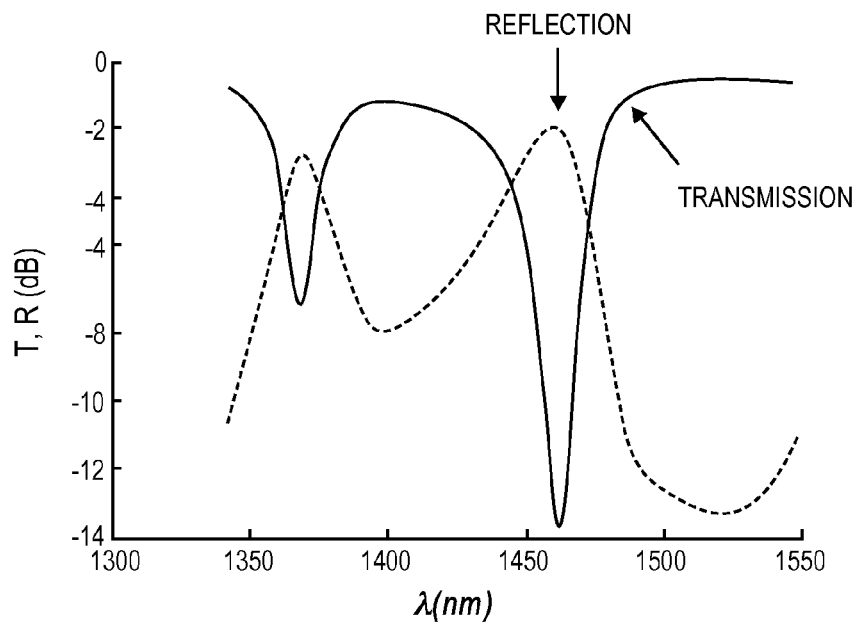
FIG. 23 is a graph illustrating an exemplary inverted cavity response of the optical filter of FIG. 22, in accordance with embodiments of the present invention.

An example of an inverted filter response is shown in FIG. 23. The reflection response has sharp peaks (maxima), while the transmission response has sharp dips (minima), which the opposite of conventional filter or Fabry-Perot cavities. In FIG. 23, the input beam spot radii were 1 and 5 μm, the power reflectivity of the slotted metallized micromirrors was 0.95 and the cavity length was 5 μm. In addition, each of the slotted micromirrors had one slot, where the slot widths were 5 μm for the input slotted micromirror 140 and 2 μm for the output slotted micromirror 2230. Furthermore, the radius of curvature of the output slotted micromirror was 11.5 μm.

Figure 24:
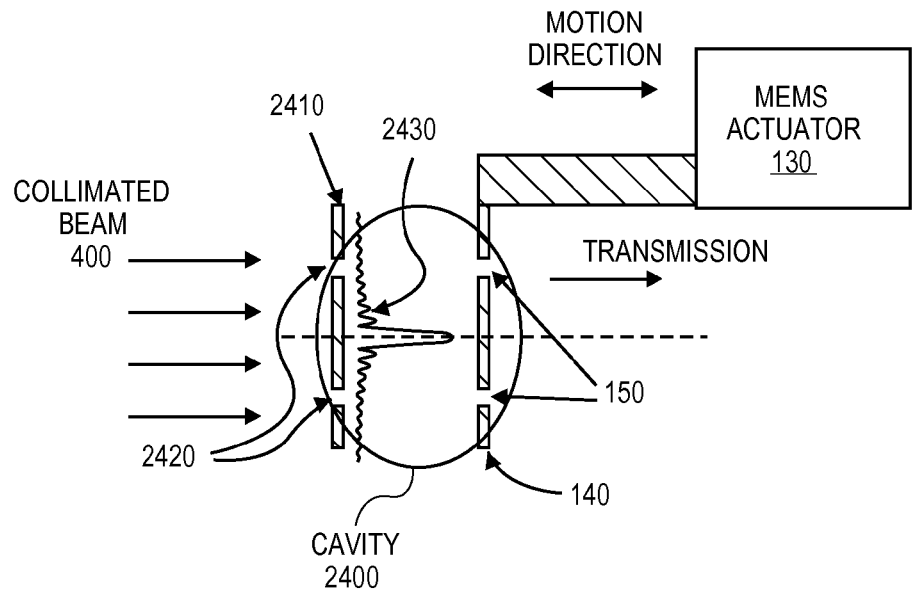
FIG. 24 illustrates another exemplary optical tunable filter including two metallized apertured optical elements, in accordance with embodiments of the present invention.

In another embodiment, as shown in FIG. 24, an in-plane Bessel beam can be generated inside the cavity 2400. In FIG. 24, the input beam 400 is a collimated beam that is incident on an input micromirror 2410 of the cavity 2400. The input micromirror 2410 has at least two slots 2410 therein to generate an in-plane Bessel beam 2430. The output slotted micromirror 140 can have one, two or multiples slots 150 allowing for transmission output. The slot widths of the input micromirror 2410 and the separation between the slots 2420 are designed with respect to the cavity length. Placing the slots 2420 and 150 away from the central peak of the Bessel beam 2430 minimizes the impact on the Bessel beam while bouncing back and forth inside the cavity 2400.

As can be seen in FIG. 24, the Bessel beam 2430 has a large central peak and smaller side lobes. The Bessel beam parameters are controlled by the dimensions of the slots 2420 of the input micromirror 2410 and the properties of the incident beam 400 on the input slotted micromirror 2410. The incident beam can be conditioned using a transforming mirror, such as the one shown in FIG. 22. In addition, by attaching one or more of the slotted micromirrors (e.g., the output slotted micromirror 140) to a MEMS actuator 130, a controllable Bessel beam 2430 can be generated.

Figure 25:
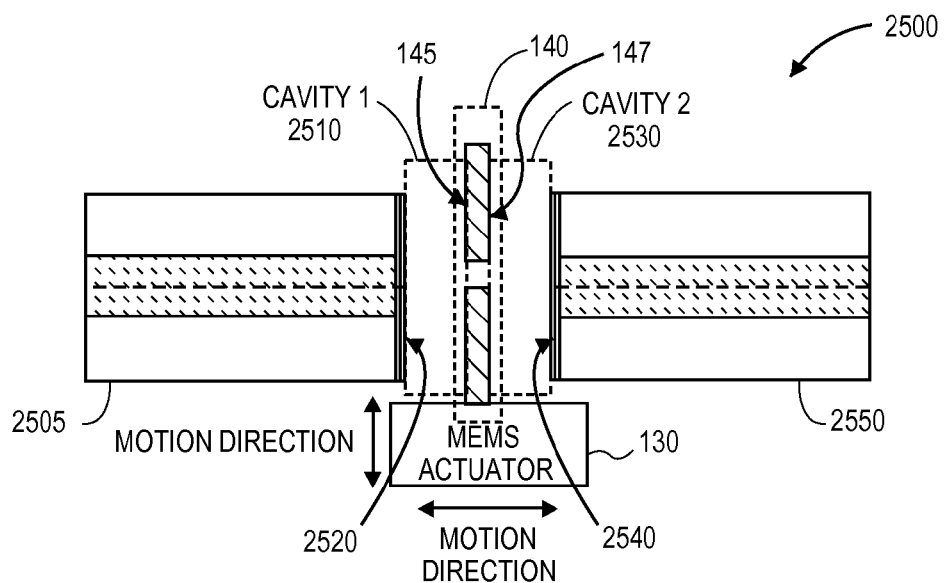
FIG. 25 illustrates a coupled cavity filter including an apertured optical element, in accordance with embodiments of the present invention.

In still another embodiment, as shown in FIG. 25, the apertured micromirror 140 can be utilized in a micro-optical bench forming a coupled cavity filter 2500. In one embodiment, a first cavity 2510 can be formed between a dielectric mirror 2520, for example coated on a surface of an optical fiber 2505, and one side 145 of the slotted micromirror 140. A second cavity 2530 can be formed between another dielectric mirror 2540, for example coated on a surface of another optical fiber 2550, and an opposite side 147 of the same slotted micromirror 140. Thus, in this embodiment, the slotted micromirror 140 is shared between the two coupled cavities 2510 and 2530. The filter response can be tuned by moving the slotted micromirror 140 using the MEMS actuator 130. Depending on the direction of motion of the slotted micromirror 140, one or both of the peak location of the filter response and the finesse of the coupled cavity filter 2500 can be tuned. In another embodiment, the dielectric micromirrors 2520 and 2540 can be replaced by slotted micromirrors.

Figure 26:
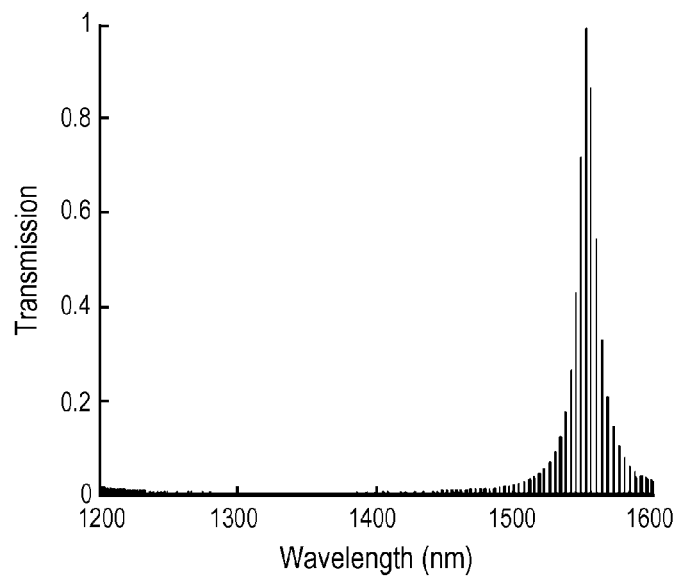
FIG. 26 is a graph illustrating an exemplary coupled cavity response of the coupled cavity filter of FIG. 25, in accordance with embodiments of the present invention.
Figure 27:
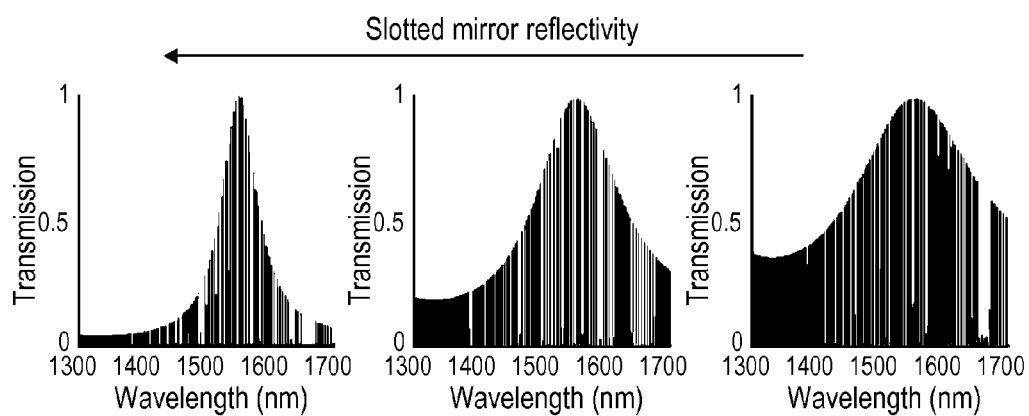
FIG. 27 is a graph illustrating the effect of varying the reflectivity of the apertured optical element in the coupled cavity filter of FIG. 25, in accordance with embodiments of the present invention.

An exemplary transmission response for the coupled cavity filter 2500 shown in FIG. 25 is shown in FIG. 26. In FIG. 26, the power reflectivities of each dielectric mirror 2520 and 2540 were 0.98 and 0.9998, respectively, and the lengths of each of the cavities 2510 and 2530 were 313 μm and 311 μm, respectively. The response maxima location can be tuned by moving the slotted micromirror using a MEMS actuator, as discussed above. Moreover, the sharpness of the response can be varied by varying the reflectivity of the slotted micromirror. For example, as shown in FIG. 27, by varying the power reflectivity of the slotted micromirror from 0.96 to 0.8 to 0.6, the sharpness of the response can be controlled.

Figure 28:
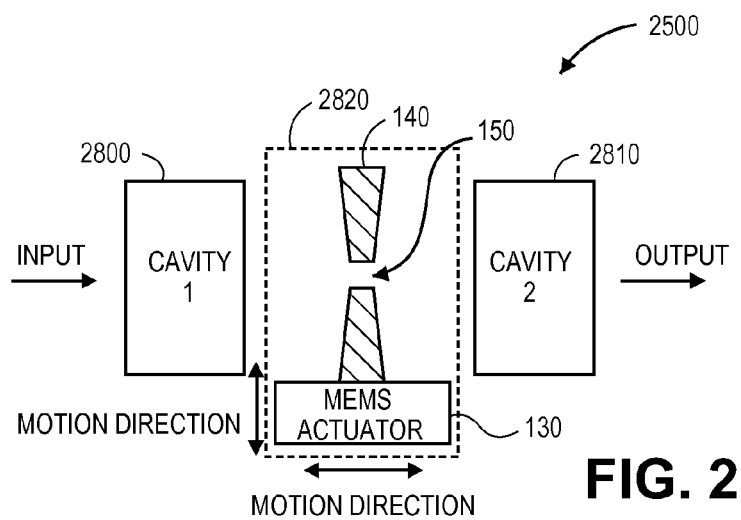
FIG. 28 illustrates another exemplary coupled cavity configuration including an apertured optical element, in accordance with embodiments of the present invention.

In another embodiment, as shown in FIG. 28, the coupled cavity filter 2500 includes two coupled cavities 2800 and 2810. However, the slotted micromirror 140 is not a part of the first cavity 2800 or the second cavity 2810. Instead, the slotted micromirror 140, together with the MEMS actuator 130, forms a coupling controlling mechanism 2820 to control the coupling between the cavities 2800 and 2810.

Figure 29A:
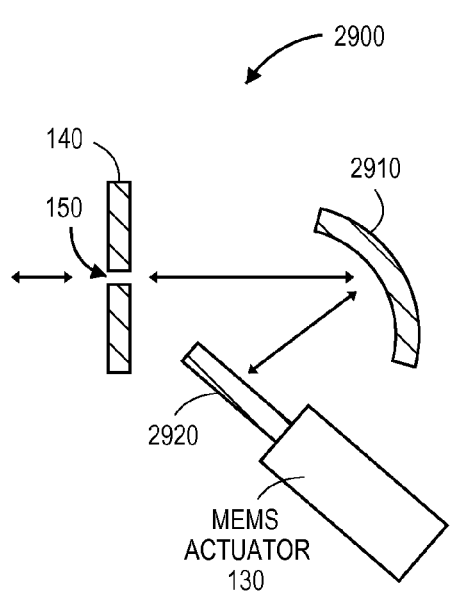
FIGS. 29A and 29B illustrate exemplary optical ring cavity configurations including an apertured optical element, in accordance with embodiments of the present invention.
Figure 29B:
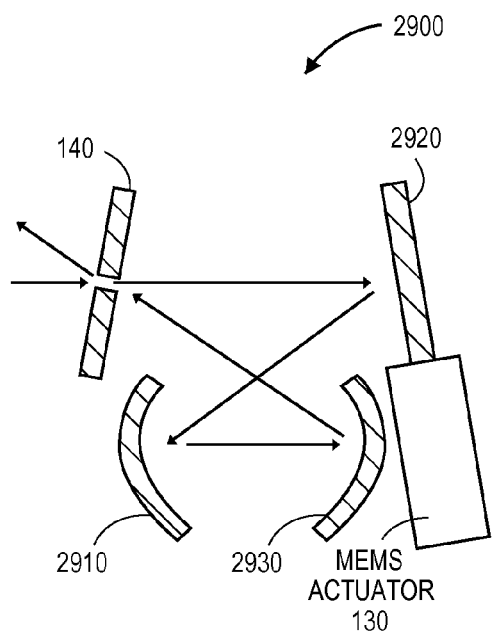

Referring now to FIGS. 29A and 29B, the apertured micromirror 140 can also be utilized in a micro-optical bench forming a ring cavity 2900. The micromirror aperture 150 allows power coupling to and from the ring cavity 2900 when the ring cavity mirrors 2910, 2920 and 2930 are metallized. Also, one or more ring cavity mirrors (e.g., mirrors 2910 and 2930) can have a curved surface to overcome beam diffraction effects inside the ring cavity 2900. The cavity medium can be air (free space) or dielectric, for example, silicon. One of the ring cavity mirrors 2920 can be attached to a MEMS actuator 130 to tune the cavity response. The insertion of a gain or amplifying medium in the cavity can be used to generate an optical source.

Referring now to FIGS. 30A and 30B, the apertured micromirror 140 can further be utilized in a micro-optical bench forming an optical micro resonator 3000. The resonator may have a rectangular shape, as shown in FIG. 30A, or a circular shape, as shown in FIG. 30B. When the resonator side walls are metallized, coupling of the power into or out of the resonator 3000 is performed through the aperture 150 or the slot of the micromirror 140. The resonator medium can be free-space (air) or a dielectric material, for example silicon.

Referring now to FIG. 31, the apertured micromirror 140 can further be utilized in a micro-optical bench forming a beam profiling instrument 3100. The beam profiling instrument 3100 includes a detector 3110 and a MEMS actuator 130 attached to the apertured micromirror 140. In an exemplary embodiment, the slot(s) 150 in the micromirror 140 are used to sample the optical intensity of the incident beam 400 at discrete spatial positions determined by the MEMS actuator 130.

Figure 32A:
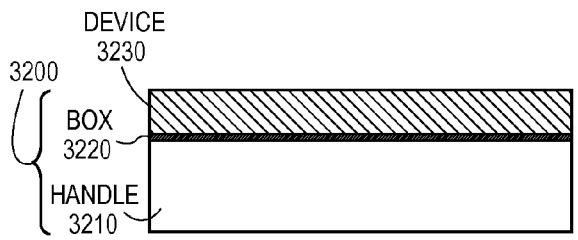
FIGS. 32A-32J illustrate exemplary fabrication steps for fabricating a micro-optical bench including an apertured optical element, in accordance with embodiments of the present invention.
Figure 32F:
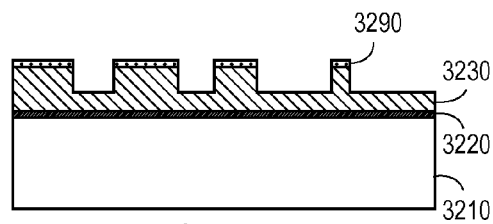
Figure 32B:
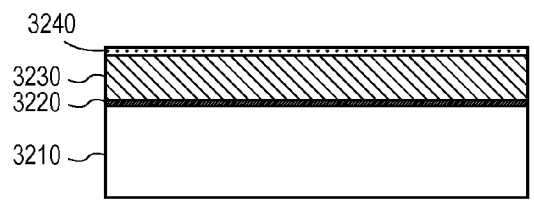
Figure 32G:
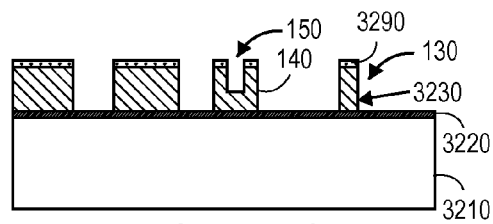
Figure 32C:
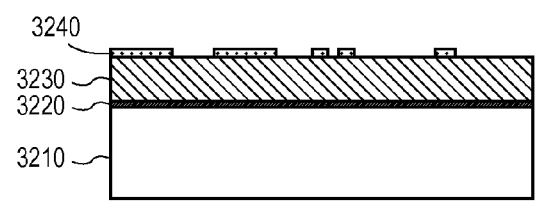
Figure 32H:
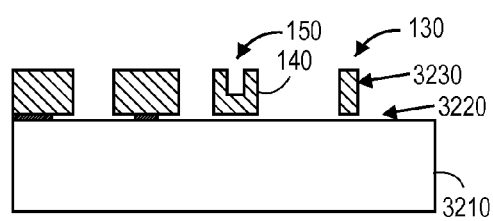
Figure 32D:
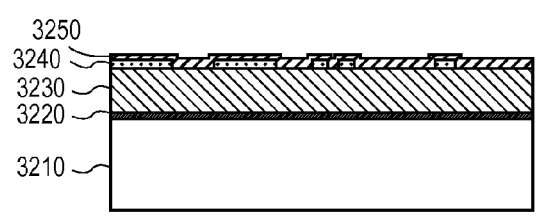
Figure 32I:
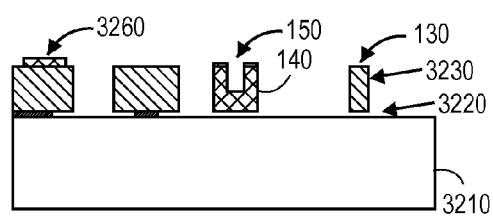
Figure 32E:
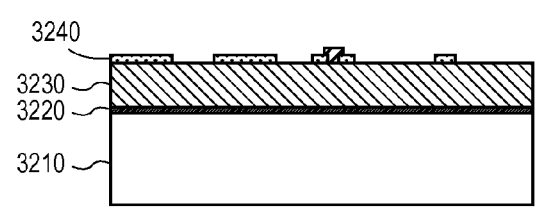

FIGS. 32A-32J illustrate exemplary fabrication steps for fabricating a micro-optical bench including an apertured optical element using Deep Reactive Ion Etching (DRIE) technology. The process starts in FIG. 32A with a substrate 3200 (e.g., SOI wafer) including a handle layer 3210, buried oxide (BOX) layer (etch stop layer) 3220 and a device layer 3230. In FIGS. 32B and 32C, a first etching mask 3240 is grown/deposited and patterned on the device layer 3230. The first etching mask 3240 will be used to etch all the surfaces on the device layer 3230. In FIGS. 32D and 32E, a second etching mask 3250 is deposited and patterned. The second mask is used in areas where one or more slots/apertures are to be etched.

Figure 32J:
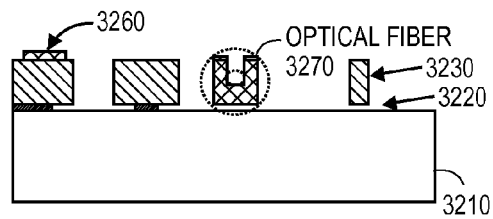

In FIG. 32F, a first DRIE step is carried out for a given depth. If the second etching mask is not consumed during the DRIE, the second etching mask will need to be removed prior to a second DRIE step, shown in FIG. 32G. The second DRIE is applied for continuous etching of the patterned device layer 3230 until the etch stop (BOX) layer 3230 is reached to form the MEMS actuator 130, optical element 140 and other components of the micro-optical bench, while the aperture/slot 150 of the optical element 140 is only partially etched without reaching the bottom of the optical element 140. In FIG. 32H, the movable parts, such as the optical element 140 and MEMS actuator 130 are released by selectively removing the BOX layer 3220. As shown in FIG. 32I, a metal layer 3260 can be deposited on the mirrors 140 and the pads using sputtering or any other metallization technique through, for example, a shadow mask. Finally, as shown in FIG. 32J, an optical fiber 3270 or other optical source (i.e., an LED or semi-conductor laser) and one or more detectors (not shown) are inserted to complete the micro-optical bench.

The use of two etching masks, as illustrated in FIGS. 32A-32J, allows for the fabrication of the apertured optical element 140, while the aperture/slot 150 is only partially etched inside the optical element. Then, after the release step shown in FIG. 32H, the optical element 140 is not broken into different parts, and as such, moves as a whole with the MEMS actuator 130. In addition, the fabrication process shown in FIGS. 32A-32J allows having more than aperture/slot 150 without losing parts in the release step.

In another embodiment, if an apertured optical element with one aperture/slot is used in the static case (not moveable), then the second etching mask may not be used at all. In yet another embodiment, if the width of the aperture/slot 150 is small enough, then it may be partially etched due to the lag effect; without a need for two etching masks. In still another embodiment, the second etching step can be carried out using alkaline etching for the formation of a triangular or trapezoidal slotted micromirror, as shown in FIG. 2B or 2C. In a further embodiment, three etching steps could be used, with the first and second etching steps being DRIE steps, as shown in FIGS. 32F and 32G, with the second DRIE etching step being followed by an alkaline etching step.

Figure 33:
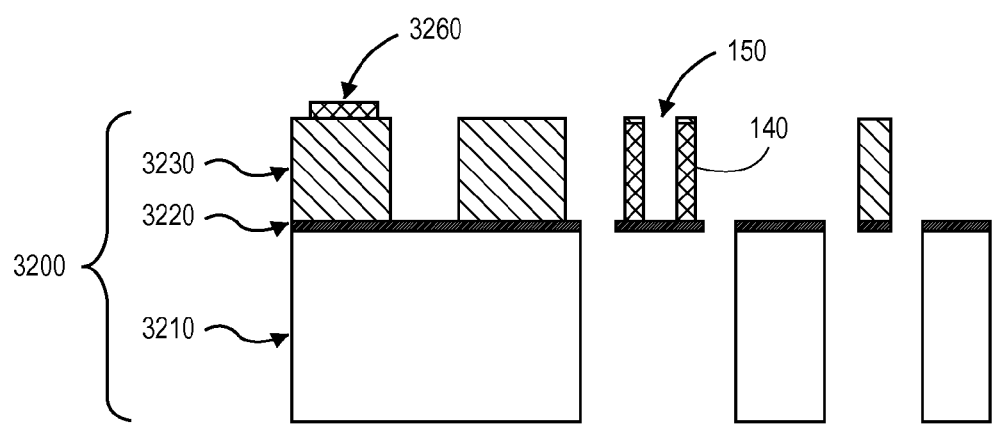
FIG. 33 illustrates another exemplary fabrication step for fabricating a micro-optical bench including an apertured optical element, in accordance with embodiments of the present invention.

Referring now to FIG. 33, in another fabrication embodiment, the aperture/slot 150 can be formed along all of the height of the micromirror 140, with the two parts of the micromirror moving together as a one entity. In this fabrication embodiment, only one mask needs to be used for etching through the device layer 3230 from the top side. Then, after DRIE, all of the openings will be etched to the BOX layer 3220. The handle layer 3210 can then be etched from the backside under the movable parts. The BOX layer 3220 under the movable parts can then be etched from the back side using another mask. However, the BOX layer 3220 under the two parts of the micromirror 140 is kept without etching, so that the BOX layer 3220 acts as a mechanical joint for the mirror parts. It should be understood that the micromirror 140 can have one or more slots 150 connected together using the BOX layer 3220 in this embodiment.

As will be recognized by those skilled in the art, the innovative concepts described in the present application can be modified and varied over a wide range of applications. Accordingly, the scope of patents subject matter should not be limited to any of the specific exemplary teachings discussed, but is instead defined by the following claims.

We claim:

1. An optical system, comprising:
a substrate having a micro-optical bench etched therein using a lithographic and deep etching technique; and
an optical element monolithically integrated with the micro-optical bench and formed using the lithographic and deep etching technique, the optical element having an aperture therein;
wherein the optical element comprises a micromirror;
wherein an optical axis of the micro-optical bench and the optical element is parallel to the substrate;

wherein the optical element is aligned to receive an incident beam along the optical axis and to at least partially transmit the incident beam therethrough via the aperture.

2. The optical system of claim 1, wherein the substrate is a silicon-on-insulator wafer.

3. The optical system of claim 1, wherein the optical element is both partially reflecting and partially transmitting.

4. The optical system of claim 1, wherein the aperture has a rectangular shape, a trapezoidal shape, a triangular shape, a rounded shape or an arbitrary shape determined by the lithographic and deep etching technique.

5. The optical system of claim 1, wherein the optical element includes at least two apertures.

6. The optical system of claim 5, wherein the at least two apertures are homogeneous with respect to at least one of a height of each of the at least two apertures, a width of each of the at least two apertures or a separation between each adjacent pair of the at least two apertures.

7. The optical system of claim 1, wherein the optical element has a reflectivity.

8. The optical system of claim 7, wherein the reflectivity of the optical element is determined at least in part by a width of the aperture.

9. The optical system of claim 7, wherein the reflectivity of the optical element is determined at least in part by an amount of offset between a center of the aperture and the optical axis of the incident beam.

10. The optical system of claim 7, wherein the reflectivity of the optical element is determined at least in part by a number of apertures within the optical element.

11. The optical system of claim 7, further comprising:
a translation device coupled to the optical element to cause a displacement thereof, the reflectivity of the optical element being determined at least in part by the displacement of the optical element with respect to the incident beam.

12. The optical system of claim 11, wherein:
the optical element includes a first part and a second part;
the aperture is formed between the first part and the second part; and
the first part is coupled to the translation device such that a width of the aperture is varied by the displacement of the first part.

13. The optical system of 11, wherein the translation device is coupled to the optical element to cause motion of the optical element at a tilted angle with respect to the optical axis of the incident beam.

14. The optical system of claim 11, wherein:
the micro-optical bench includes a Fabry-Perot interferometer within an inertial sensor;
the inertial sensor includes an optical fiber; and
the optical element and optical fiber collectively form a low-finesse Fabry Perot cavity within the Fabry-Perot interferometer.

15. The optical system of claim 11, wherein the micro-optical bench includes an optical filter formed using the optical element, the optical filter having a filter response tunable by the translation device causing motion of the optical element in a same direction as the optical axis of the incident beam.

16. The optical system of claim 15, further comprising:
a multi-layer coated optical fiber, the optical filter being formed between the multi-layer coated optical fiber and the optical element.

17. The optical system of claim 15, wherein the micro-optical bench further includes an additional apertured optical element, the optical filter being formed between the optical element and the additional apertured optical element.

18. The optical system of claim 17, wherein the optical filter operates as a two-beam interferometer to produce a two-beam interference response with sinusoidal fringes.

19. The optical system of claim 17, wherein at least one of the optical element and the additional apertured optical element has a curved surface profile to produce an inverted filter response in the optical filter.

20. The optical system of claim 17, wherein:
the incident beam is a collimated beam incident on the additional apertured optical element;
the additional apertured optical element includes at least two apertures therein; and
an in-plane Bessel beam is produced within the optical filter from the collimated beam via the additional apertured optical element.

21. The optical system of claim 11, wherein the micro-optical bench includes a coupled cavity filter formed by the optical element, the coupled cavity filter having a filter response tunable by the translation device.

22. The optical system of claim 11, further comprising:
a detector optically coupled to receive an output of the optical element through the aperture, the output corresponding to an optical intensity of the incident beam at discrete spatial positions determined by the translation device.

23. The optical system of claim 11, wherein the translation device is a Micro Electro-Mechanical Systems (MEMS) actuator.

24. The optical system of claim 1, wherein at least one side of the optical element is metallized.

25. The optical system of claim 1, wherein the optical element includes at least two layers of dielectric material such that the aperture passes through each of the layers.

26. The optical system of claim 1, wherein the optical element is a photonic crystal mirror.

27. The optical system of claim 1, wherein the optical element is curved in two dimensions or three dimensions.

* * * * *